United States Patent [19]

Chu et al.

[11] Patent Number: 4,853,339
[45] Date of Patent: Aug. 1, 1989

[54] METHOD OF SENSITIZING PB-SALT EPITAXIAL FILMS FOR SCHOTTKY DIODES

[75] Inventors: Tak-Kin Chu, Bethesda; Francisco Santiago, Elkridge, both of Md.

[73] Assignee: The United States of America as represented by the Secretary of the Navy, Washington, D.C.

[21] Appl. No.: 224,962

[22] Filed: Jul. 27, 1988

[51] Int. Cl.$^4$ .................. H01L 31/18; H01L 21/44
[52] U.S. Cl. .................. 437/2; 148/DIG. 37; 148/DIG. 63; 148/DIG. 72; 148/DIG. 140; 357/16; 357/30; 437/5; 437/81; 437/84; 437/126; 437/160; 437/185; 437/176; 437/245; 437/904
[58] Field of Search .................. 148/DIG. 22, 25, 37, 148/39, 63, 72, 80, 118, 120, 140, 172, 153, 174; 156/610–615; 357/16, 17, 29, 30, 63, 67, 15; 437/2, 3, 5, 51, 48, 54, 39, 81, 84, 126, 127, 168, 160, 185, 187, 188, 175, 176, 245, 904, 787

[56] References Cited

U.S. PATENT DOCUMENTS

| | | | |
|---|---|---|---|
| 4,021,833 | 5/1977 | Gurnee | 357/30 |
| 4,080,723 | 3/1978 | Holloway | 437/3 |
| 4,137,625 | 2/1979 | White | 437/3 |
| 4,154,631 | 5/1979 | Schoolar | 437/84 |
| 4,227,948 | 10/1980 | Jensen et al. | 357/16 |
| 4,302,531 | 11/1981 | Cox et al. | 437/5 |
| 4,350,990 | 9/1982 | Lo | 437/246 |
| 4,406,050 | 9/1983 | Chu et al. | 437/3 |
| 4,442,446 | 4/1984 | Booky et al. | 357/30 |

Primary Examiner—Brian E. Hearn
Assistant Examiner—William Bunch
Attorney, Agent, or Firm—Kenneth E. Walden; Roger D. Johnson

[57] ABSTRACT

In a process of preparing an infrared sensitive photodiode comprising the steps of
(1) forming by vacuum deposition an epitaxial layer of a semiconductor alloy material selected from the group consisting of PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_x$, $Pb_ySn_{1-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$, and $0<z<1$, to cover at least a portion of the surface of a substrate composed of an infrared transparent single crystal material selected from the group consisting of
(a) alkali metal halides and
(b) alkaline earth halides;
(2) vacuum depositing Pb metal onto a portion of the epitaxial layer of semiconductor alloy material to form a non-Ohmic Pb metal contact; and
(3) forming an Ohmic contact on another portion of the epitaxial layer of semicondcutor alloy material;
the improvement comprising:
after step (1) but prior to step (2), forming a layer of a lead halide selected from the group consisting of $PbCl_2$, $PbBr_2$, $PbF_2$, and mixtures thereof on the epitaxial layer of semiconductor alloy material by exposing the epitaxial layer to vapor of the lead halide in the presence of a flow of oxygen-containing gas wherein
(a) the lead halide vapor is produced by heating the solid lead halide at a temperature $T_1$ wherein $200°C. \leq T_1 \leq 500°C.$,
(b) the epitaxial layer of semiconductor material is heated at a temperature $T_2$ wherein $100°C. \leq T_2 \leq 300°C.$ and wherein $100°C. \leq T_1 - T_2 \leq 350°C.$, and
(c) wherein the oxygen-containing gas is selected from the group consisting of (i) air, (ii) oxygen, and (iii) a mixture of from 20 to less than 100 weight percent of oxygen and an inert diluant gas which will not react with the lead halide, alkali metal halides, alkaline earth halides, or the semiconductor alloy material.

11 Claims, 2 Drawing Sheets

METHOD OF SENSITIZING PB-SALT EPITAXIAL FILMS FOR SCHOTTKY DIODES

BACKGROUND OF THE INVENTION

This invention relates to photodetectors and more particularly to infrared-sensitive photodiodes.

It is well established that single crystal films of lead chalcogenides, lead tin chalcogenides, and lead cadmium chalcogenides can be epitaxially grown on heated alkali metal halide and alkaline earth halide substrates by vacuum evaporation. The chalcogenides used include the sulfides, selenides, tellurides, and mixtures thereof. The substrates are single crystals of infrared transparent alkali metal halides and alkaline earth halides. Examples include barium fluoride, strontium fluoride, calcium fluoride, lithium fluoride, sodium chloride, potassium chloride, etc.

It is also well known that the vacuum deposition of a metal contact of certain materials such as lead or indium, on the surface of an epitaxial layer of a lead chalcogenide, lead tin chalcogenide, or lead cadmium chalcogenide creates a non-Ohmic Schottky barrier at the point of contact, resulting in an infrared sensitive photodiode. Vacuum depositing a contact of certain other metals (e.g., Au, Ni, or Pt) at another point on the epitaxial layer provides the Ohmic contact necessary for measuring the photovoltage of the device.

Attention is called to U.S. Pat. No. 4,263,604, entitled "Graded Gap Semiconductor Detector," issued on Apr. 21, 1981 to James D. Jensen and Richard B. Schoolar wherein an extensive bibliography of articles and patents dealing with these Schottky barrier devices is listed in the background of the invention.

Alan C. Bouley, Harold R. Riedl, James D. Jensen, and Richard B. Schoolar in U.S. Pat. No. 4,442,446, entitled "Sensitized Epitaxial Infrared Detector," disclose that the presence of halide ions in the interface region between a non-Ohmic lead metal and an epitaxial layer of II-IV-VI semiconductor alloy material (i.e., lead chalcogenide, lead tin chalcogenide, or lead cadmium chalcogenide) increases the performance of these infrared detecting diodes. The number of rejects in the manufacturing process is also reduced. In their process Bouley et al. mix the lead halide salt in with the lead used to form the epitaxial layer of semiconductor material. As a result, the halide ions are distributed throughout the semiconductor layer.

Tak-Kin Chu and Alan C. Bouley in U.S. Pat. No. 4,406,050, entitled "Method for Fabricating Lead Halide Sensitized Infrared Photodiodes," disclose a method in which the epitaxial layer of semiconductor material is first deposited on an infrared transparent substrate in the conventional manner. Then a layer of lead halide ($PbCl_2$, $PbBr_2$, $PbF_2$) is vapor deposited in air at atmospheric pressure on the surface of the semiconductor material prior to the vacuum deposition of the non-Ohmic Pb metal contact. The lead halide source and the epitaxial layer/substrate are kept at the same temperature in the range of from about 175° C. to about 225° C. This procedure produces even fewer rejects than the Bouley et al. process. Unfortunately, this $PbCl_2$ deposition step requires at least 6 hours and preferably at least 8 hours. As a result, the rate of production is much lower than is desirable. Therefore, it would be desirable to achieve the same excellent results as the Chu et al. process but in a much shorter time.

SUMMARY OF THE INVENTION

Accordingly, an object of this invention is to provide an improved method of producing infrared sensitive Schottky barrier devices.

Another object of this invention is to reduce the time it takes to produce the reliable, high performance lead halide sensitized infrared detector Schottky barrier devices.

These and other objects of this invention are accomplished by providing in a process for preparing an infrared sensitive photodiode comprising the steps of (1) forming by vacuum deposition an epitaxial layer of a semiconductor alloy material selected from the group consisting of PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$, and $0<z<1$, to cover at least a portion of the surface of a substrate composed of an infrared transparent single crystal material selected from the group consisting of (a) alkali metal halides and (b) alkaline earth halides;

(2) vacuum depositing Pb metal onto a portion of the epitaxial layer of semiconductor alloy material to form a non-Ohmic Pb metal contact; and (3) forming an Ohmic contact on another portion of the epitaxial layer of semiconductor alloy material;

the improvement comprising:

after step (1) but prior to step (2), forming a layer of a lead halide selected from the group consisting of $PbCl_2$, $PbBr_2$, $PbF_2$, and mixtures thereof on the epitaxial layer of semiconductor alloy material by exposing the epitaxial layer to vapor of the lead halide in the presence of a flow of oxygen-containing gas wherein (a) the lead halide vapor is produced by heating the solid lead halide at a temperature $T_1$ wherein $200°C. \leq T_1 \leq 500°C.$, (b) the epitaxial layer of semiconductor material is heated at a temperature $T_2$ wherein $100°C. \leq T_2 \leq 300°C.$ and wherein $100°C. \leq T_1 - T_2 \leq 350°C.$, and (c) wherein the oxygen-containing gas is selected from the group consisting of (i) air, (ii) oxygen, and (iii) a mixture of from 20 to less than 100 weight percent of oxygen and an inert dilutant gas which will not react with the lead halide, alkali metal halides, alkaline earth halides, or the semiconductor alloy material.

BRIEF DESCRIPTION OF THE DRAWINGS

A more complete appreciation of this invention and many of the attendant advantages thereof will be readily appreciated as the same becomes better understood by reference to the following detailed description when considered in connection with the accompanying drawings.

DETAILED DESCRIPTION OF THE PREFERRED EMBODIMENT

Figure 1:
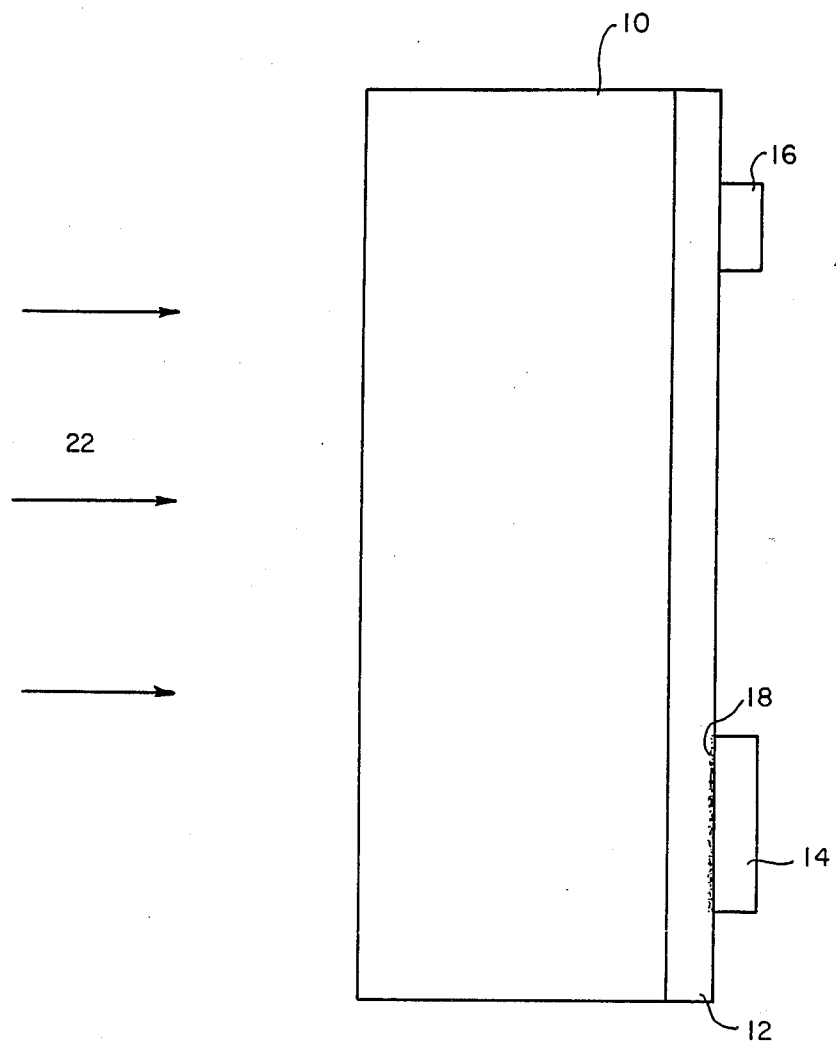
FIG. 1 is a schematic representation of a cross-sectional side view of an infrared Schottky barrier diode produced by the process of this invention.

It is known that the presence of halide ions in the zone or region between an epitaxial layer of a II-IV-VI semiconductor alloy and a non-Ohmic Pb contact (i.e. Schottky barrier forming means) of certain sensitive photodiodes substantially enhances the performance of those diodes. FIG. 1 schematically represents a cross-sectional side view of the device. A single crystal thin film of semiconductor material 12 is epitaxially grown by vacuum deposition onto an infrared transparent single crystal substrate 10. An Ohmic contact 16 and a non-Ohmic contact 14 are each vacuum deposited onto the semiconductor thin film 12 by conventional means. The halide ion region 18 comprises halide ions which are present on and extend a short distance into the epitaxial semiconductor film 12 under the non-Ohmic contact 18.

Suitable substrate 10 materials must be infrared transparent because the infrared radiation 22 must pass through the substrate 10 before reaching the semiconductor film 12. Single crystals of alkali metal halides (e.g., KCl, NaCl, KBr) and alkaline earth halides (e.g., $BaF_2$, $SrF_2$, $Ba_wSr_{1-w}F_2$ with $0<w<1$) have been found to be suitable. However, certain of the compounds (e.g., NaCl, KCl) are less preferred or even unsuitable because they are hygroscopic. In conclusion, those substrate 10 materials which are suitable for use in the cited prior art infrared sensitive photodiodes are also suitable for the photodiodes produced by the processes of the present invention.

The epitaxial layer of semiconductor material 12 is produced by vacuum deposition of a lead chalcogenide, lead tin chalcogenide, or lead cadmium chalcogenide onto the heated substrate 10. The chalcogenides used include sulfides, selenides, tellurides, and mixtures thereof. More specifically, some of the materials which may be used are represented by the following formulas: PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$, and $0<z<1$, and preferably $0.9<y<1$ and $0.8<x<1$. Preferred among these materials are the lead chalcogenides: PbS, PbSe, PbTe, $PbS_xSe_{1-x}$, and $PbS_xTe_{1-x}$ wherein $0<x<1$.

The epitaxial layer of semiconductor material 12 is grown on the substrate by conventional vacuum deposition techniques. Examples of these techniques are disclosed in U.S. Pat. No. 3,716,424, entitled "Method of Preparation of Lead Sulfide PN Junction Diodes", which was issued to Richard B. Schoolar on Feb. 13, 1973 and U.S. Pat. No. 4,154,631, entitled "Equilibrium Growth Techniques for Preparing $PbS_xSe_{1-x}$ Epilayers," which was issued to Richard B. Schoolar on May 15, 1979, herein incorporated by reference.

After the epitaxial layer of semiconductor material has been deposited, and prior to lead (Pb) metal deposition, the semiconductor is annealed at about 170° C. for about 30 minutes in vacuum to desorb oxygen on its surface. The semiconductor is then cooled to room temperature.

Conventionally, a Schottky barrier is next formed by vacuum depositing a dot or strip of lead (Pb) metal onto a portion of the epitaxial layer of semiconductor alloy to form a non-Ohmic contact 14. This step is performed with the lead (Pb) evaporation source at a temperature of about 600° C. or more and at a pressure of not more than $10^{-5}$ torr and preferably not more than $10^{-6}$ torr. This process takes about 10 minutes.

Chu and Bouley (U.S. Pat. No. 4,406,050) disclose the vapor deposition of a lead halide which is $PbCl_2$, $PbBr_2$, $PbF_2$, or mixtures thereof onto the outer surface of the epitaxial layer of semiconductor alloy 12 prior to the vacuum deposition of Pb metal to form the non-Ohmic contact 14. $PbCl_2$ is preferred because of its relatively low toxicity. In the Chu and Bouley process, the epitaxial layer of II-IV-VI semiconductor alloy material 12 is exposed to the lead halide vapor in the presence of static air at normal atmospheric pressure. In that process the lead halide vapor source and the epitaxial layer of semiconductor material are heated at the same temperature. At least 8 hours are required for that process step to achieve the desired results.

We have now discovered a method which reduces the time required for the deposition of the lead halide to less than one hour while still achieving the preferred results. In the present method, the lead halide vapor source is maintained at one temperature ($T_1$) and the epitaxial semiconductor layered substrate is maintained at a lower temperature ($T_2$). Also, a flow of air or other suitable oxygen containing gas is passed over the epitaxial semiconductor layer during the lead halide deposition.

The lead halide source is maintained at a temperature $T_1$ while the epitaxial semiconductor alloy layer (and infrared transparent substrate) is maintained at a temperature $T_2$ with $T_1>T_2$. More specifically, $200°\ C. \leq T_1 \leq 500°\ C.$, $100°\ C. \leq T_2 \leq 300°\ C.$, and $100°\ C. \leq T_1 - T_2 \leq 350°\ C.$. Preferably, $300°\ C. \leq T_1 \leq 450°\ C.$, $150°\ C. \leq T_2 \leq 280°\ C.$, and $150°\ C. \leq T_1 - T_2 \leq 300°\ C.$ More preferably, $390°\ C. \leq T_1 \leq 410°\ C.$, $160°\ C. \leq T_2 \leq 170°\ C.$, and $230°\ C. \leq T_1 - T_2 \leq 250°\ C.$ Secondly, in place of the static air used in Chu et al. (U.S. Pat. No. 4,406,050), a stream of suitable dry oxygen containing gas mixes with the lead halide vapor and the mixture then flows to the surface of the epitaxial semiconductor to improve the deposition of lead halide. Suitable oxygen containing gases include (a) dry air, (b) pure oxygen, and (c) a dry mixture of from 20 to less than 100 weight percent of oxygen ($O_2$) in an inert dilutant gas. An inert dilutant gas is one that does not react with the lead halide, the epitaxial semiconductor alloy layer, or even the alkali metal halide or alkaline earth halide of the infrared transparent substrate. Suitable dilutant gases include, but are not limited to, argon, helium, neon, nitrogen, and mixtures thereof. Dry air (oxygen, nitrogen, argon) may be enriched with oxygen to produce a suitable oxygen-containing gas.

The oxygen-containing gas is injected into the reactor in the zone between the lead halide source and the epitaxial semiconductor layer so that the oxygen and lead halide (e.g., $PbCl_2$) mix before reaching the semiconductor layer. The oxygen containing gas may also be injected so that it acts as a carrier gas for the lead halide. The flow of oxygen containing gas is adjusted to provide a fresh supply of oxygen without interferring with the deposition of lead halide on the epitaxial semiconductor alloy layer.

Figure 2:
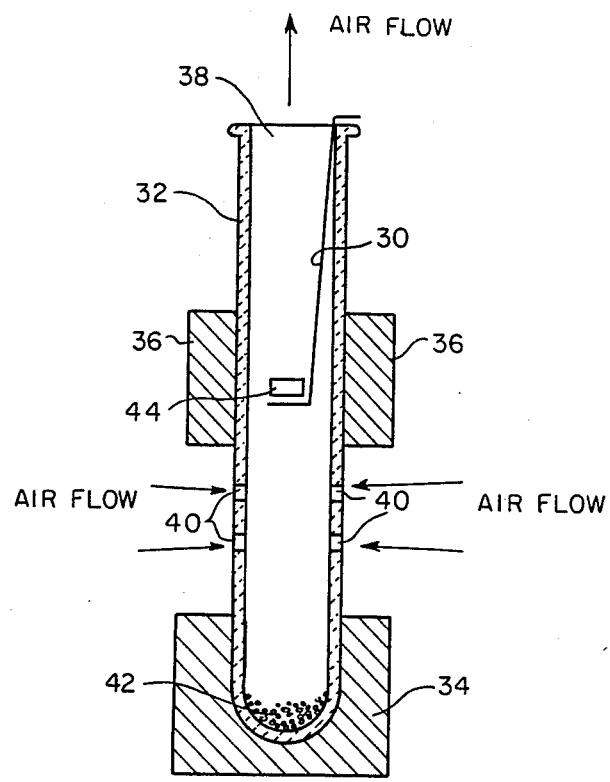
FIG. 2 shows typical laboratory apparatus which are used in present processes for introducing halide ions onto the semiconductor surface.

FIG. 2 is a cross-sectional schematic representation of typical laboratory apparatus used for the lead halide deposition step. The solid lead halide (e.g., $PbCl_2$) 42 is placed in the bottom of a glass reaction tube 32. An epitaxial layer of a semiconductor alloy on a substrate 44 is supported on a Kenthal wire support 30 above the solid lead halide 42 in the reaction tube 32. A first zone heater 34 is used to heat the solid lead halide 42 at a temperature $T_1$ to produce lead halide vapor which rises in the reaction tube 32 toward the semiconductor alloy and substrate 44. A second zone heater 36 is used to maintain the semiconductor alloy and substrate 44 at a lower temperature $T_2$. Air passages 40 are located in the wall of the glass reaction tube 32 between the solid lead halide 42 and the semiconductor and substrate 44. The air passages 40 allow air to flow into the reaction tube 32 where the air mixes with the lead halide vapor. The air/lead halide vapor mixture then flows up and onto the epitaxial layer of semiconductor alloy and substrate 44 where lead halide is deposited. The air/lead halide vapor mixture then flows up and out through the opening 38 in the top of the reaction tube 32.

A excess of the lead halide may be present without significantly changing the results. Also the air that flows in through the air passages 40 is heated in the reaction tube 32 and in effect dried.

Referring again to FIG. 1, after the lead halide (e.g., $PbCl_2$) has been deposited, the non-Ohmic lead (Pb) metal contact 14 is vacuum deposited on to the lead halide coated epitaxial layer of semiconductor alloy 12 according to the prior art methods described above. An Ohmic contact 16 is then formed on the epitaxial layer of semiconductor alloy 12 according to prior art methods.

Note that while the lead halide may be distributed over the entire epitaxial layer of semiconductor alloy 12, only that portion lying in the zone 18 between the non-Ohmic Pb contact 14 and the epitaxial layer of semiconductor alloy 12 will improve the operation of the device.

The general nature of the invention having been set forth, the following examples are presented as specific illustrations thereof. It will be understood that the invention is not limited to these specific examples, but is susceptible to various modifications that will be recognized by one of ordinary skill in the art.

EXAMPLES

Six separate batches of samples each containing 8 films of PbS, 8 films of $PbS_{0.5}Se_{0.5}$, and 8 films of $Pb_{0.94}Cd_{0.06}S$ (divided between two identical I.R. transparent substrates) were treated with $PbCl_2$ vapor using the process of the present invention. Each sample was arranged into 8 groups of 3 films (PbS, $PbS_{0.5}Se_{0.5}$, $Pb_{0.94}Cd_{0.06}S$) so that films of different compositions received the same exposure to the $PbCl_2$ vapor. The same conditions were used in each of the six batches. The apparatus used is shown schematically in FIG. 2. $PbCl_2$ powder 42 was placed in the bottom of a glass reaction tube 32. A first zone heater 34 maintained the $PbCl_2$ powder 42 at a temperature ($T_1$) of 395°–400° C. to produce $PbCl_2$ vapor. The sample 44 was supported on a Kenthal wire support 30 above the air passages 40 and $PbCl_2$ powder 42. A second zone heater 36 maintained the sample 44 at a temperature ($T_2$) of 145°–150° C. Air flowed in through air passages (holes) 40 in the side of the heated reaction tube 32 and mixed with the rising $PbCl_2$ vapor, flowed over the sample 44, and then flowed out of the opening 38 at the top of the reaction tube 32. An exhaust hood removed the exiting $PbCl_2$/air mixture. $PbCl_2$ exposure time for the samples in each of the 6 batches was 1 hour. A non-Ohmic lead contact and an Ohmic contact were formed on each of the films in a convention manner to produce diodes.

Measurements showed that all 48 PbS diodes, all 48 $PbS_{0.5}Se_{0.5}$ diodes, and all 48 $Pb_{0.94}Cd_{0.06}S$ diodes had detectivities, $D^*$, greater than $10^{11}$ (cm $Hz^{\frac{1}{2}}$)/w at 77° K. The process of U.S. Pat. No. 4,406,050 (Chu et al.) requires an exposure time of 8 hours to achieve comparable results.

Obviously, numerous modifications and variations of the present invention are possible in light of the above teachings. It is therefore to be understood that within the scope of the appended claims the invention may be practiced otherwise than as specifically described herein.

What is claimed and desired to be secured by Letters Patent of the United States is:

1. In a process for preparing an infrared sensitive photodiode comprising the steps of
    (1) forming by vacuum deposition an epitaxial layer of a semiconductor alloy material selected from the group consisting of PbS, PbSe, PbTe, $PbS_xSe_{1-x}$, $PbS_xTe_{1-x}$, $PbSe_xTe_{1-x}$, $Pb_ySn_{1-y}S$, $Pb_ySn_{1-y}Se$, $Pb_ySn_{1-y}Te$, $Pb_ySn_{1-y}S_xSe_{1-x}$, $Pb_ySn_{1-y}S_xTe_{1-x}$, $Pb_ySn_{1-y}Se_xTe_{1-x}$, $Pb_zCd_{1-z}S$, $Pb_zCd_{1-z}Se$, $Pb_zCd_{1-z}Te$, $Pb_zCd_{1-z}S_xSe_{1-x}$, $Pb_zCd_{1-z}S_xTe_{1-x}$, and $Pb_zCd_{1-z}Se_xTe_{1-x}$, wherein $0<x<1$, $0<y<1$, and $0<z<1$, to cover at least a portion of the surface of a substrate composed of an infrared transparent single crystal material selected from the group consisting of
        (a) alkali metal halides and
        (b) alkaline earth halides;
    (2) vacuum depositing Pb metal onto a portion of the epitaxial layer of semiconductor alloy material to form a non-Ohmic Pb metal contact; and
    (3) forming an Ohmic contact on another portion of the epitaxial layer of semiconductor alloy material;
    the improvement comprising:
    after step (1) but prior to step (2), forming a layer of a lead halide selected from the group consisting of $PbCl_2$, $PbBr_2$, $PbF_2$, and mixtures thereof on the epitaxial layer of semiconductor alloy material by exposing the epitaxial layer to vapor of the lead halide in the presence of a flow of oxygen-containing gas wherein
        (a) the lead halide vapor is produced by heating the solid lead halide at a temperature $T_1$ wherein $200°$ C. $\leq T_1 \leq 500°$ C.,
        (b) the epitaxial layer of semiconductor material is heated at a temperature $T_2$ wherein $100°$ C. $\leq T_2 \leq 300°$ C. and wherein $100°$ C. $\leq T_1 - T_2 \leq 350°$ C., and
        (c) wherein the oxygen-containing gas is selected from the group consisting of (i) air, (ii) oxygen, and (iii) a mixture of from 20 to less than 100 weight percent of oxygen and an inert dilutant gas which will not react with the lead halide, alkali metal halides, alkaline earth halides, or the semiconductor alloy material.

2. The process of claim 1 wherein $300°$ C. $\leq T_1 \leq 450°$ C., $150°$ C. $\leq T_2 \leq 280°$ C., and $150°$ C. $\leq T_1 - T_2 \leq 300°$ C.

3. The process of claim 1 wherein $390°$ C. $\leq T_1 \leq 410°$ C., $160°$ C. $\leq T_2 \leq 170°$ C., and $230°$ C. $\leq T_1 - T_2 \leq 250°$ C.

4. The process of claim 1 wherein the lead halide is $PbCl_2$.

5. The process of claim 1 wherein the oxygen-containing gas is air.

6. The process of claim 1 wherein the oxygen-containing gas is oxygen.

7. The process of claim 1 wherein the oxygen-containing gas is a mixture of oxygen and the inert dilutant gas.

8. The process of claim 7 wherein the inert dilutant gas is selected from the group consisting of nitrogen, helium, argon, neon, and mixtures thereof.

9. The process of claim 1 wherein the epitaxial semiconductor alloy material is selected from the group consisting of PbS, $PbS_xSe_{1-x}$, $PbS_xTe_{1-x}$, $Pb_ySn_{1-y}S$, $Pb_ySn_{1-y}S_xSe_{1-x}$, $Pb_ySn_{1-y}S_xTe_{1-x}$, $Pb_zCd_{1-z}S$, $Pb_zCd_{1-z}S_xSe_{1-x}$, and $Pb_zCd_{1-z}S_xTe_{1-x}$, wherein $0.01 < x < 1$, $0 < y < 1$, and $0 < z < 1$.

10. The process of claim 1 wherein the epitaxial semiconductor alloy material is selected from the group consisting of PbS, PbSe, PbTe, $PbS_xSe_{1-x}$, and $PbSe_xTe_{1-x}$ wherein $0 < x < 1$.

11. The process of claim 10 wherein the epitaxial semiconductor material is PbS.

* * * * *